United States Patent [19]

Alwan

[11] Patent Number: 5,676,853
[45] Date of Patent: Oct. 14, 1997

[54] MASK FOR FORMING FEATURES ON A SEMICONDUCTOR SUBSTRATE AND A METHOD FOR FORMING THE MASK

[75] Inventor: James J. Alwan, Boise, Id.

[73] Assignee: Micron Display Technology, Inc., Boise, Id.

[21] Appl. No.: 653,071

[22] Filed: May 21, 1996

[51] Int. Cl.$^6$ ................................................. B05D 5/00
[52] U.S. Cl. .................... 216/11; 216/42; 216/49; 216/51; 216/67; 156/643.1; 156/659.11; 427/199; 427/201
[58] Field of Search .................. 216/42, 43, 49, 216/51, 11, 67; 156/659.11, 643.1; 427/197, 199, 201, 282

[56] References Cited

U.S. PATENT DOCUMENTS

| | | | |
|---|---|---|---|
| 4,407,695 | 10/1983 | Deckman et al. | 156/643 |
| 5,194,297 | 3/1993 | Scheer et al. | 427/180 |
| 5,510,156 | 4/1996 | Zhao | 427/534 |
| 5,548,181 | 8/1996 | Jones | 313/309 |

Primary Examiner—R. Bruce Breneman
Assistant Examiner—Julie E. Stein
Attorney, Agent, or Firm—Seed and Berry LLP

[57] ABSTRACT

A mask and a method for forming a mask on a surface of an underlying layer of material used in semiconductor device manufacturing. The mask is a mixture of mask particles and spacer particles. The spacer particles space the mask particles apart from one another to control the distance and the uniformity of the distribution of mask particles across the surface of the underlying layer. The spacer particles and mask particles have different physical properties that allow the spacer particles to be selectively removed from the surface of the underlying layer. The spacer particles are preferably removed from the surface of the underlying layer by selectively etching the spacer particles from the underlying layer. After the spacer particles are removed from the underlying layer, the mask particles remain on the underlying layer to provide spaced apart mask elements on the surface of the underlying layer.

31 Claims, 3 Drawing Sheets

MASK FOR FORMING FEATURES ON A SEMICONDUCTOR SUBSTRATE AND A METHOD FOR FORMING THE MASK

This invention was made with government support under contract NO. DABT 63-93-C-0025 by the Advance Reserch Projects Agency ("ARPA"). The government has certain rights to this invention.

TECHNICAL FIELD

The present invention relates to a mask, and a method for forming a mask, in which a plurality of mask particles are distributed across the, surface of the substrate and spaced apart from one another within a controlled distance.

BACKGROUND OF THE INVENTION

Microelectronic devices are typically fabricated, in part, by forming features on selected layers of a semiconductor wafer. The individual features are often formed by patterning a mask to protect selected portions of an underlying layer of material during subsequent processing steps. The mask of the present invention may be used in the fabrication of virtually any type of microelectronic device, but it is particularly useful in the fabrication of field emission displays ("FEDs") in use or proposed for use in computers, television sets, camcorder viewfinders, and a variety of other applications.

FEDs are one type of flat panel display in which a baseplate with a generally planar emitter substrate is juxtaposed to a faceplate with a substantially transparent display screen. The baseplate has a number of emitters formed on the emitter substrate that project from the emitter substrate towards the faceplate. The emitters are typically configured into discrete emitter sets in which the bases of the emitters in each emitter set are commonly connected. The baseplate also has an insulator layer formed on the emitter substrate and an extraction grid formed on the insulator layer. A number of holes are formed through the insulator layer and extraction grid in alignment with the emitters to open the emitters to the faceplate. In operation, a voltage differential is established between the extraction grid and the emitters to extract electrons from the emitters.

The display screen of the faceplate is coated with a substantially transparent conductive material to form an anode, and the anode is coated with a cathodoluminescent layer. The anode draws the electrons extracted from the emitters through the extraction grid and across the vacuum gap between the extraction grid and the cathodoluminescent layer of material. As the electrons strike the cathodoluminescent layer, light emits from the impact site and travels through the anode and the glass panel of the display screen. The emitted light from each of the areas becomes all or part of a picture element.

One objective of field emission displays is to produce a desired brightness of light in response to the emitted electrons. The brightness at each picture element depends, in part, upon the density of emitters in the emitter sets corresponding to each picture element. In general, it is desirable to have a constant emitter density from one emitter set to another, and also from one area in an individual emitter set to another. Thus, it is desirable to space the emitters apart from one another by a substantially uniform distance, and to make the emitters substantially the same size and shape.

One emerging method for forming emitters is to randomly distribute a number of beads on a hard oxide layer that has been deposited over the emitter substrate. The beads may be distributed across the surface of the oxide layer by depositing a solution in which the beads are suspended onto the oxide layer, spinning the substrate to spread the solution, and evaporating the liquid to leave the beads on the oxide layer. The beads may also be distributed across the surface of the oxide layer by a dry dispensing method in which a dry mixture of beads is propelled towards the oxide layer in a jet of air or inert gas. The mixture is then allowed to settle on the oxide layer to form a mask of randomly distributed particles on the surface of the oxide layer. The masked areas of the oxide layer are then etched with an etchant selective to the material of the oxide layer to form a random distribution of island-like oxide areas under the beads. After the beads are removed from the oxide layer, the emitters are formed under the island-like areas of oxide by isotropically etching the substrate.

One problem with this method for patterning the oxide layer is that the island-like oxide areas, and thus the emitters, may not have a uniform size and shape. The desired diameter of the base of each emitter is generally the diameter of a single, isolated bead. However, in this patterning method, the beads often agglomerate into clusters that remain intact as they are distributed across the surface of the substrate. It will be appreciated that clusters of beads produce larger, irregular-shaped islands of oxide which result in larger, irregular-shaped emitters. As a result, the emitters produce by this emitter patterning method may not have a uniform size and shape.

Another problem with this emitter patterning method is that the emitters may not be uniformly spaced apart from one another. Since the beads are distributed randomly across the surface of the oxide layer, it is difficult to control the space between the beads. Thus, the space between the emitters produced by this emitter patterning method may vary significantly from one area on the display to another.

In light of the problems associated with patterning an oxide layer to form emitters, it would be desirable to develop a mask that produces emitters with a substantially uniform size and shape, and controls the space between the emitters.

SUMMARY OF THE INVENTION

The present invention is a mask, and a method of making the mask, that comprises a mixture of mask particles and spacer particles distributed across a layer of material on a semiconductor wafer. The spacer particles space the mask particles apart from one another to prevent the mask particles from clustering together and to control the distance between the mask particles. The mixture is preferably deposited onto the layer of material to form a substantially contiguous monolayer of mask and spacer particles across the surface of the wafer. The spacer particles are then selectively removed from the surface of the layer such that the mask particles remain on the layer in a pattern of spaced apart masked elements.

The spacer particles are preferably made from a material with different physical properties than those of the mask particles. The difference in the physical properties may be exploited to selectively remove the spacer particles from the surface of the layer, while allowing the mask particles to remain in substantially the same location on the layer. The mask and spacer particles are preferably made from materials with different etching selectivities that allow the spacer particles to be selectively etched from the wafer. In other embodiments, the physical differences may allow the spacer particles to be removed by selectively breaking a bond between the spacer particles and the surface layer, or by selectively evaporating, sublimating, or melting the spacer particles from the layer of material.

The spacer particles and the underlying layer of material upon which the spacer particles are deposited are preferably made from materials that may be selectively etched without etching the mask particles. The spacer particles and the underlying layer of material may accordingly be etched in a single process step to form a desired pattern of island-like elements under the mask particles.

DETAILED DESCRIPTION OF THE INVENTION

The present invention is a mask used in semiconductor processing that controls the spacing between randomly distributed mask particles and substantially prevents the mask particles from clustering together. An important aspect of the invention is to form the mask from a mixture of mask and spacer particles that have different physical properties which allow the spacer particles to be selectively removed from the surface of the substrate. Another important aspect of the invention is to select the size of the spacer particles and/or adjust the ratio of mask particles to spacer particles to control the spacing between the mask particles. Thus, when a substantially contiguous monolayer of spacer and mask particles covers a wafer, the spacer particles substantially isolate the mask particles from one another and control the distance between the mask particles. Also, after the spacer particles and mask particles cover the substrate, the spacer particles are selectively removed from the surface of the substrate by processes that exploit the differences in the physical properties between the spacer particles and the mask particles. As a result, isolated mask particles spaced apart from one another by a controlled distance remain on the surface of the substrate. FIGS. 1-8, in which like reference numbers refer to like parts throughout the various figures, illustrate several embodiments of the mask of the present invention.

Figure 1:
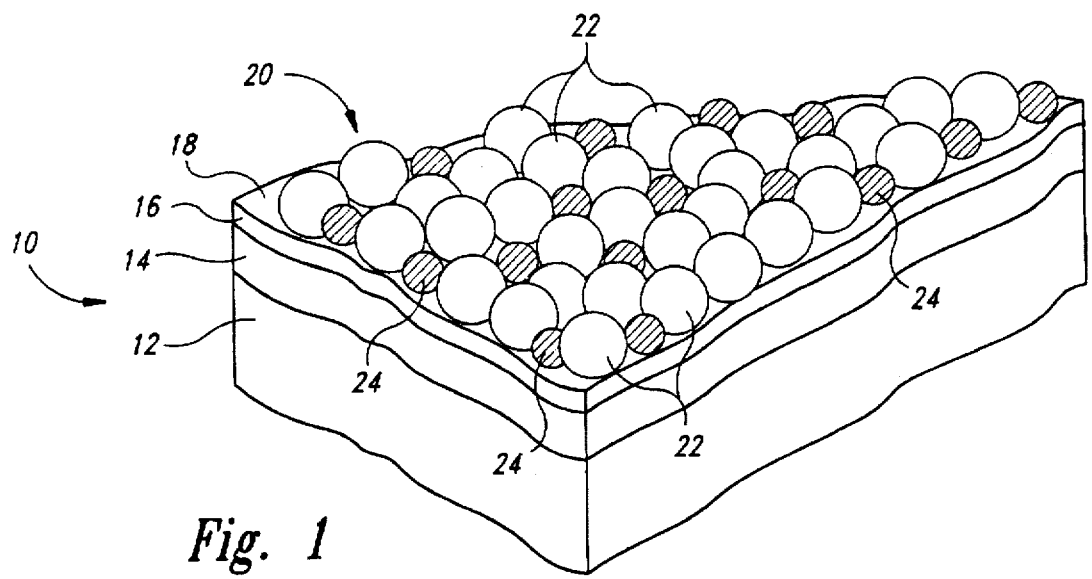
FIG. 1 is an isometric view of a mask in accordance with the invention on a semiconductor substrate.

FIG. 1 illustrates a mask 20 in accordance with the invention covering a baseplate 10 for an FED. Although the use of the mask 20 and the formation of the mask 20 is disclosed in association with processing the baseplate 10 of an FED, it will be appreciated that the present invention is not limited to FEDs and may be used in many other semiconductor processing applications. More specifically, the mask 20 is useful in any application in which it is desirable to form a large number of small, spaced apart features in a layer of material of a semiconductor device.

The baseplate 10 typically has a base layer 12, an amorphous silicon layer 14 covering the base layer 12, and an oxide layer 16 covering the silicon layer 14. The base layer 12 may be made from a suitable semiconductive material such as silicon, or the base layer 12 may be made from another material such as glass and covered with a suitable conductive material such as a metal. The mask 20 is a mixture of spacer particles 22 and mask particles 24 that is deposited onto the surface 18 of the oxide layer 16 to form a monolayer of particles on the oxide layer 16. The spacer particles 22 separate the mask particles 24 from each other to prevent the mask particles 24 from clustering together before and while they are distributed on the oxide layer 16. The spacer particles 22 also control the distance between the mask particles 24. As discussed in greater detail below, a pattern of spaced apart mask particles 24 is formed from the mask 20 by selectively removing the spacer particles 22 from the oxide layer 16 to expose the surface 18 of the oxide layer 16 between the mask particles 24.

Figure 2:
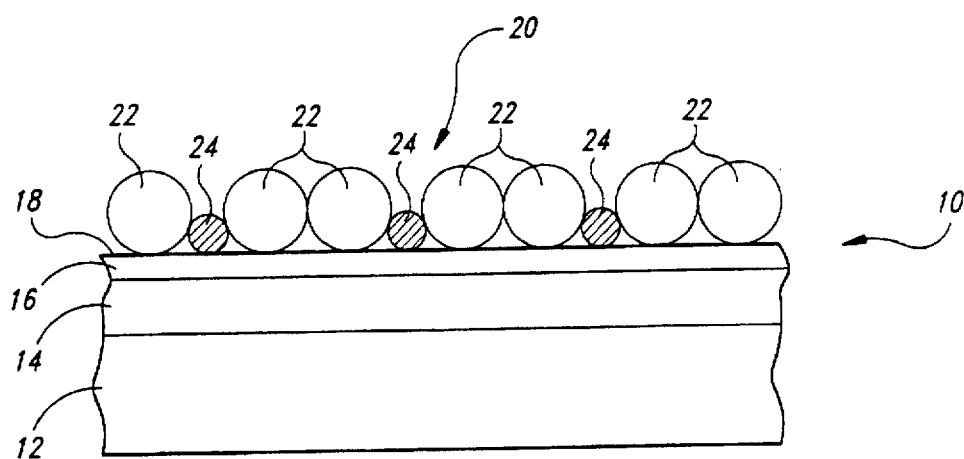
FIG. 2 is a partial schematic cross-sectional view of a mask in accordance with the invention on a semiconductor wafer.

FIG. 2 illustrates an initial step in a method for forming a pattern of spaced apart mask particles 24 in accordance with the invention. The mask 20 is preferably a substantially contiguous monolayer made from a predetermined ratio of spacer particles 22 and mask particles 24. The mixture of spacer particles 22 and mask particles 24 may be deposited onto the surface 18 of the oxide layer 16 by suspending the spacer particles 22 and mask particles 24 in a solution with a volatile liquid, and then dispensing the solution onto the oxide layer 16 while the baseplate 10 rotates. Suitable volatile liquids include water and/or alcohol. The centrifugal force generated by the baseplate 10 spreads the colloidal particle solution in a layer across the surface 18 of the oxide layer 16. The volatile liquid in the solution then evaporates which leaves a substantially uniform monolayer of spacer particles 22 and mask particles 24 on the surface 18 of the oxide layer 16.

In another embodiment, the mask 20 is deposited onto the surface 18 of the oxide layer 16 by a dry dispense method in which the mixture of spacer particles 22 and mask particles 24 is propelled in a jet of air or other gas towards the oxide layer 16. The spacer particles 22 and mask particles 24 settle on the surface 18 of the oxide layer 16 to form a substantially contiguous monolayer of particles. By forming the mask 20 from a substantially contiguous monolayer of particles, the spacer particles 22 effectively control the spacing between the mask particles 24 and isolate the mask particles 24 from each other.

Figure 3:
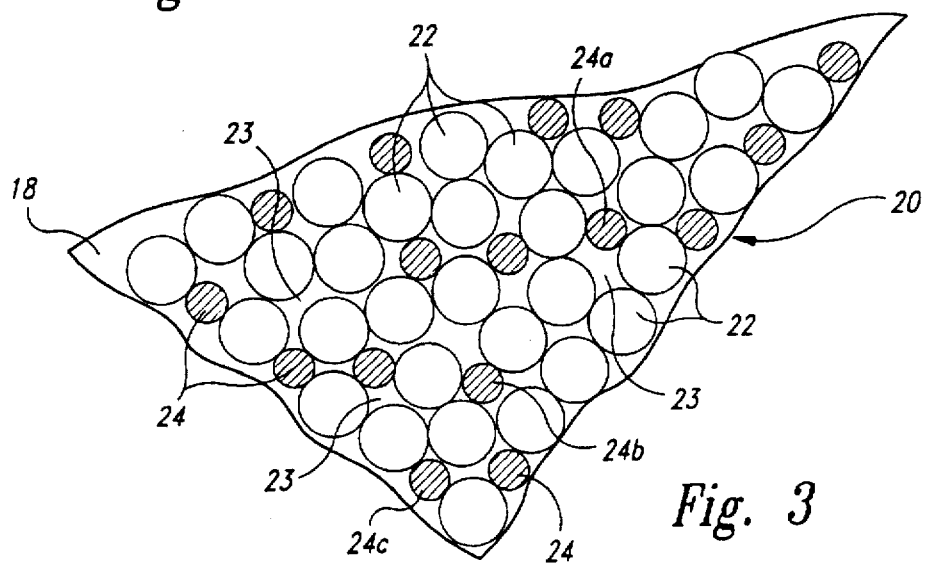
FIG. 3 is a top plan view of a mask in accordance with the invention.
Figure 4:
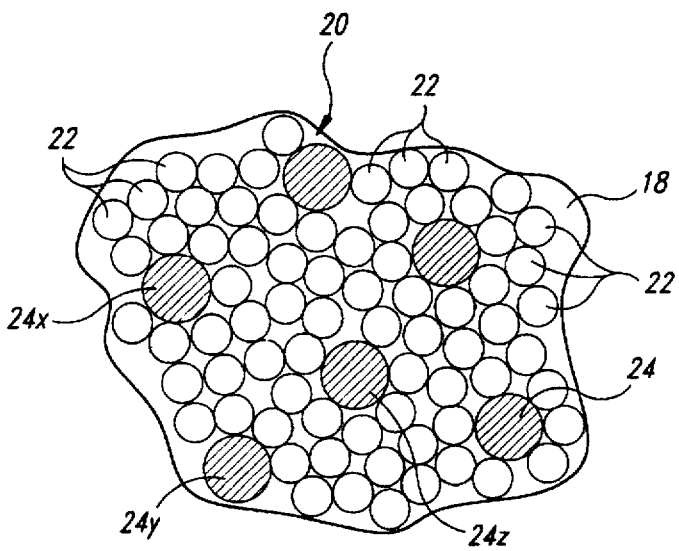
FIG. 4 is a top plan view of another mask in accordance with the invention on a semiconductor substrate.

The distance between the mask particles 24 is controlled by the size of the spacer particles 22, and by the ratio of spacer particles 22 to mask particles 24 in the mask 20. In general, the size and shape of the mask particles 24 corresponds to the cross-sectional dimension of the features to be formed under the mask particles 24. Similarly, the number of mask particles 24 corresponds to the desired number of features. The distribution of mask particles 24 is accordingly controlled by manipulating the characteristics of the spacer particles 22. To better isolate the mask particles from one another, for example, relatively large spacer particles 22 are desirable because the mask particles 24 tend to reside in the interstitial spaces between the spacer particles 22. On the other hand, to space each of the mask particles 24 apart from one another by a more uniform distance, a large number of relatively small spacer particles is desirable because a variance in the number of small spacer particles 22 between mask particles 24 does not affect the average distance between the mask particles 24 as much as the same variance of larger spacer particles 22. FIGS. 3 and 4 further illustrate embodiments of the mask 20 with different sizes of spacer particles 22, and different ratios of spacer particles 22 to mask particles 24.

FIG. 3 illustrates an embodiment of the mask 20 in which the ratio of spacer particles 22 to mask particles 24 is approximately 2:1, and the spacer particles 22 have a relatively large diameter compared to the mask particles 24. The large spacer particles 22 form large interstitial spaces 23 in which the mask particles 24 tend to reside. As a result, the large spacer particles substantially isolate the mask particles 24 from one another. Yet, a low ratio of large spacer particles 22 to mask particles 24 may cause a larger variance in the distance between the mask particles 24. For example, a single additional spacer particle 22 between mask particles 24(a) and 24(b) causes the distance between mask particles 24(a) and 24(b) to be approximately 100% greater than the distance between mask particles 24(b) and (c). Thus, by providing a low ratio of spacer particles 22 to mask particles 24, the distance between the mask particles 24 may not be controlled within acceptable limits.

FIG. 4 illustrates another embodiment of the mask 20 in which the ratio of spacer particles 22 to mask particles 24 is approximately 10:1, and the spacer particles 22 have a relatively small diameter compared to the mask particles 24. Increasing the ratio of spacer particles 22 to mask particles 24 provides better control of the distance between the mask particles 24 because more spacer particles 22 are desirably positioned between the mask particles 24. As a result, a variance of one spacer particle 22 in between each pair of mask particles 24 does not significantly alter the spacing of the mask particles 24. For example, FIG. 4 illustrates that approximately 3-4 spacer particles 22 are positioned between each pair of mask particles 24. Thus, a single additional spacer particle 22 between mask particles 24(x) and 24(y) causes the distance between particles 24(x) and 24(y) to be only approximately 50% greater than the distance between mask particles 24(y) and 24(z). Accordingly, a higher ratio of spacer particles 22 to mask particles 24 generally enhances the uniformity of the distance between the spacer particles 24.

The isolation of mask particles 24 may be further enhanced by imparting selected chemical and/or electrical properties to the spacer particles 22 and the mask particles 24. For example, the mask particles 24 may have a strong negative charge that causes the mask particles 24 to repel each other, and the spacer particles 22 may have a relatively weak positive charge to attract the mask particles 24. It will be appreciated that the charge on the spacer particles 22 is sufficiently weak to prevent the spacer particles 22 from significantly repelling one another. The mask particles 24 and spacer particles 22 may be appropriately charged by surface chemical treatments applied to the particles, or by other suitable techniques that impart a desired charge to the particles.

After the mask 20 is formed, the spacer particles 22 are selectively removed from the oxide layer 16. The spacer particles 22 and mask particles 24 are made from materials that have different physical properties which may be exploited to remove only the spacer particles 22 from oxide layer 16. It will be appreciated that the spacer particles 22 and mask particles 24 are generally made from different materials, but they may also be made from the same material and then treated to impart different physical characteristics to the particles.

Figure 5:
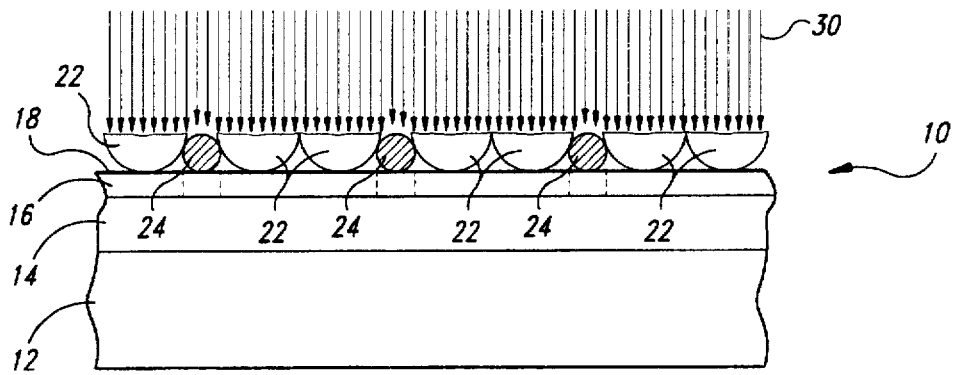
FIG. 5 is a partial cross-sectional view of the mask of FIG. 2 after a portion of the spacer particles have been removed from the semiconductor wafer.

FIG. 5 illustrates one embodiment of the selective removal of the spacer particles 22 from the surface 18 of the oxide layer 16 in which the spacer particles are selectively etched with an etchant 30. The spacer particles 22 and the mask particles 24 are accordingly made from different materials that are selective to different etchants. The etchant 30 is preferably used in a highly anisotropic etching process that removes material along a vertical profile without substantially undercutting the mask particles 24. Suitable anisotropic etching processes include plasma etching and reactive ion etching. As shown in FIG. 5, for example, the etchant 30 only removes material subject to the etchant in the vertical direction such that the mask particles 24 effectively shade the areas of the oxide layer 16 under the full diameter of the mask particles 24.

In a specific embodiment of the mask 20 of FIG. 5, the spacer particles 22 are made from a silicon oxide, and the mask particles 24 are made from latex or polystyrene. The spacer particles 22 are removed using a plasma etch or an ion-assisted etch. A suitable etch chemistry selective to the silicon oxide spacer particles 22 includes, but is not limited to: $CF_4$, $CHF_3$, and He. This anisotropic etch may have the following conditions: 10–30 standard cubic centimeters of $CF_4$, 20–70 standard cubic centimeters of $CHF_3$, and 50–100 standard cubic centimeters of He at 250 W and 500 mtorr.

In a preferred embodiment, the spacer particles 22 and the oxide layer 16 are both made from materials that are etched by the etchant 30. Although the spacer particles 22 and the oxide layer 16 may be made from the same material, it will be appreciated that they may also be made from different materials so long as the etchant 30 removes the spacer particles 22 and oxide layer 16 at a higher rate than it removes the mask particles 24. Thus, by making the spacer particles 22 and the oxide layer 16 from materials that the etchant 30 can remove without affecting the mask particles 24, the spacer particles 22 and the unprotected portions of the oxide layer 16 may be removed in a single process step.

In another embodiment (not shown), the spacer particles 22 are selectively removed from the surface 18 of the oxide layer 16 by agitating the baseplate 10 to selectively break the bonds between the spacer particles 22 and the oxide layer 16. In this embodiment, the spacer particles 22 and mask particles 24 have different surface characteristics that cause the mask particles 24 to bond to the oxide layer 16 with more force than the spacer particles 22. Suitable surface characteristics include, but are not limited to, electrical charges imparted to the particles by electrical or chemical treatments, chemical affinities on the surfaces of the particles, and magnetic properties of the particles. For example, spacer particles 22 made from a hygroscopic material and mask particles 24 made from a hydrophilic material may be vibrated in an ultrasonic bath of water that imparts sufficient energy to break the spacer particles 22 away from the oxide layer 16 without loosening the mask particles 24 from the oxide layer 16.

In still another embodiment (not shown), the spacer particles 22 are made from a material that either melts, sublimates, or evaporates at a lower temperature than that of the mask particles 24. The spacer particles 22 are accordingly removed from the surface 18 of the oxide layer 16 by heating the spacer and mask particles 22 and 24 to the critical temperature of the spacer particles 22 at which they change from one phase to another.

Figure 6:
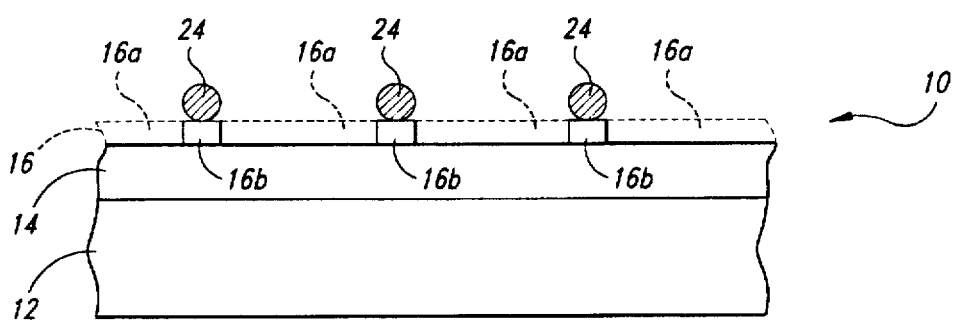
FIG. 6 is a partial schematic cross-sectional view of the mask of FIG. 5 after island-like portions have been formed under the mask particles.
Figure 7:
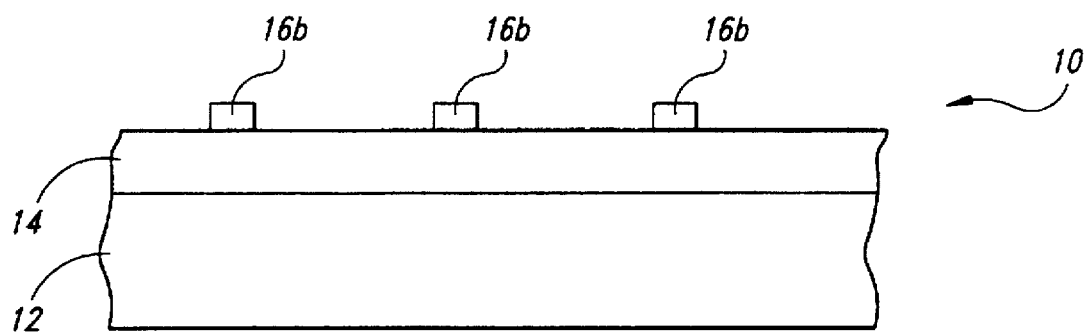
FIG. 7 is a partial schematic cross-sectional view of the substrate of FIG. 6 after the mask particles have been removed.

FIGS. 6 and 7 illustrate the additional steps for forming a pattern of spaced apart mask elements from the oxide layer 16. FIG. 6 illustrates the baseplate 10 after the unprotected portions 16a of the oxide layer 16 have been removed from the baseplate 10 by an anisotropic etching process to form island-like mask elements 16b on the surface of the silicon layer 14. FIG. 7 illustrates the baseplate 10 after the mask particles 24 have been removed from the top of the island-like mask elements 16b by any known mechanical or chemical removal process. After the mask particles 24 are removed from the mask element 16b, features may be formed from the material of the silicon layer 14 beneath the mask elements 16b. It will be appreciated that the silicon layer 14 may be a layer of any other suitable material depending upon the type of features that are to be formed under the mask elements 16b.

Figure 8:
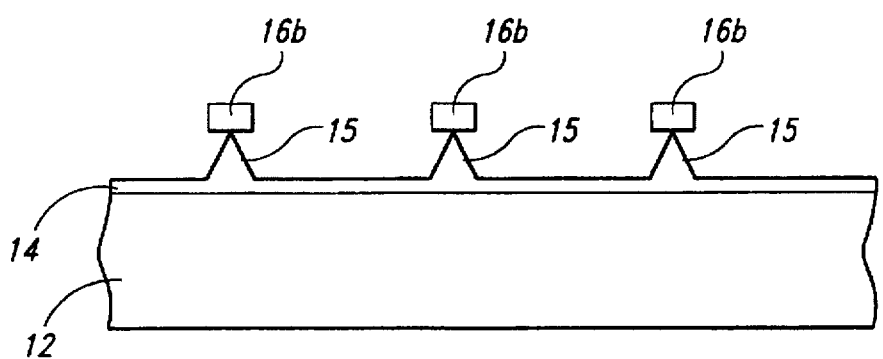
FIG. 8 is a partial schematic cross-sectional view of the semiconductor substrate of FIG. 7 after emitter tips have been formed under the island-like portions of the upper layer.

FED emitters are one typical type of feature formed under the mask elements 16b. FIG. 8 illustrates a number of conical emitters 15 formed from the portions of the silicon layer 14 beneath the mask elements of 16b. To form the emitters 15, the silicon layer 14 is isotropically etched in an etching process known in the art. The mask elements 16b are then etched to selective wet etch to remove the mask elements 16b from the tips of the emitters 15. When the mask elements 16b are made from an oxide, a wet etchant made from a buffered hydrofluoric solution may be used to remove the mask elements 16b. It will be appreciated that other features may be formed under the mask elements 16b, and thus the invention is not limited to fabricating emitters for FEDs.

One advantage of the present invention is that the spacer particles 22 inhibit the mask particles 24 from agglomerating into clusters as they are distributed across the surface of a wafer. Compared to conventional masks and patterning methods, therefore, the present invention increases the occurrences of single, isolated mask particles across the surface of the wafer. As a result, the features produced with the mask of the invention have a substantially uniform size and shape.

Another advantage of the present invention is that the distance between the mask particles 24 may be controlled to space the mask particles 24 apart from one another by a substantially uniform distance. Thus, compared to conventional masks, the features formed under the mask elements of the present invention are spaced apart from one another by a more uniform distance.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A method for forming a pattern on an underlying layer of material, comprising:
   providing a mixture of spacer particles and mask particles, the spacer particles having a property that is different from the mask particles so that the spacer particles are selectively removable from the layer of material; and
   covering the underlying layer with the mixture of mask particles and spacer particles to form a mask in which the mask particles are spaced apart from one another by the spacer particles.

2. The method of claim 1 wherein the covering step further comprises depositing a ratio of spacer particles and mask particles onto the underlying layer to space the mask particles apart from one another by an average number of spacer particles that is a function of the ratio of spacer particles to mask particles.

3. The method of claim 1, further comprising selectively removing the spacer particles from the surface of the layer leaving the spaced apart mask particles on the layer.

4. The method of claim 3 wherein the removing step comprises selectively etching the spacer particles from the surface of the underlying layer with a etchant.

5. The method of claim 4 wherein the underlying layer is made from a material that is etched by the etchant selective to the spacer particles, and wherein the etching step further comprises etching material from the underlying layer in areas that were covered by the spacer particles.

6. The method of claim 4 wherein the underlying layer is made from silicon dioxide, the spacer particles are made from a silicon oxide, and the mask particles are made from a material selected from the group consisting of latex and polystyrene.

7. The method of claim 6 wherein the etchant is comprised of $CF_4$, $CHF_3$, and He.

8. The method of claim 7 wherein the etching step further comprises plasma etching the spacer particles and the underlying layer with the etchant at 250 W and 500 mtorr.

9. The method of claim 3 wherein the spacer particles are made from a first material and the mask particles are made from a second material, the first material melting at a lower temperature than the second material, and wherein the removing step comprises heating the spacer and mask particles to a temperature above the melting temperature of the first material.

10. The method of claim 3 wherein the spacer particles bond to the underlying layer with less force than the mask particles, and wherein the removing step comprises agitating the particles with sufficient energy to break the bonds between the spacer particles and the underlying layer without breaking the bonds between the mask particles and the underlying layer.

11. The method of claim 1 wherein the providing step comprises mixing a ratio of mask particles to spacer particles of between 1:2 and 1:20 to produce the mask, and wherein the depositing step comprises spacing the mask particles apart from one another by 2–10 spacer particles.

12. The method of claim 1 wherein the mask particles comprise beads having a diameter between 0.2–5.0 microns and the spacer particles comprise beads having a diameter of between 0.2–5.0 microns.

13. The method of claim 1 wherein the mask particles are made from a material selected from the group consisting of latex and polystyrene.

14. The method of claim 13 wherein the spacer particles are made from silicon oxide.

15. The method of claim 1 wherein the spacer particles are made from silicon oxide.

16. A method for forming a pattern of spaced apart mask elements on a surface of a substrate, the method comprising the steps of:
   depositing a ratio of mask particles and spacer particles onto the surface of the substrate to form a layer of mask and spacer particles on the substrate, the spacer particles having a property different from the mask particles so that the spacer particles are selectively removable from the substrate, and the spacer particles being positioned between the mask particles to space the mask particles apart from one another; and
   selectively removing the spacer particles from the surface of the substrate, the mask particles remaining on the surface of the substrate to form a pattern on the substrate.

17. The method of claim 16 wherein the ratio of mask particles to spacer particles is between 1:2 and 1:20.

18. The method of claim 17 wherein the mask particles are spaced apart from one another by 1–10 spacer particles.

19. The method of claim 16 wherein the mask particles comprise beads having a diameter of between 0.2–5.0 microns and the spacer particles comprise beads having a diameter of between 0.2–5.0 microns.

20. The method of claim 16 wherein the removing step comprises selectively anisotropically etching the spacer particles from the surface of the substrate with an etchant.

21. The method of claim 20 wherein the substrate is made from a material that is etched by the etchant selective to the spacer particles, and wherein the etching step further comprises etching the substrate in areas that were covered by the spacer particles.

22. The method of claim 16 wherein the spacer particles are made from a first material and the mask particles are made from a second material, the first material sublimating at a lower temperature than the second material, and wherein the removing step comprises heating the spacer and mask particles to a temperature above the sublimation temperature of the first material.

23. The method of claim 16 wherein the spacer particles bond to the substrate with less force than the mask particles, and wherein the removing step comprises agitating the substrate with sufficient energy to break the bonds between the spacer particles and the substrate without breaking the bonds between the mask particles and the substrate.

24. In the manufacturing of field emission displays, a method for forming emitters on an emitter substrate, comprising the steps of:

covering an oxide layer on an emitter substrate with a layer of mask particles and spacer particles in a pattern in which the mask particles are generally spaced apart from one another by the spacer particles;

selectively removing the spacer particles from the oxide layer leaving the mask particles on the oxide layer and exposing the surface of the oxide layer between the mask particles;

etching the exposed surface of the oxide to form island-like mask elements on the emitter substrate; and etching the emitter substrate to form substantially conical emitters under the island-like mask elements.

25. The method of claim 24 wherein the covering step further comprises depositing a ratio of spacer particles and mask particles onto the oxide layer.

26. The method of claim 25 wherein the ratio of mask particles to spacer particles is between 1:2 and 1:20, and wherein the depositing step comprises spacing the mask particles apart from one another by 1–10 spacer particles.

27. The method of claim 24 wherein the removing step further comprises selectively etching the spacer particles from the surface of the oxide layer.

28. The method of claim 24 wherein the oxide layer and the spacer particles are selectively etched with respect to the mask particles, and wherein the etching step further comprises etching the material from the oxide layer and the spacer particles in a single process step.

29. A method for forming a pattern on an underlying layer of material, comprising:

covering the underlying layer with a layer of particles; and removing selected particles from the underlying layer to form a mask of spaced apart non-selected particles on the substrate.

30. The method of claim 29 wherein the covering step comprises depositing a plurality of particles on the substrate to form a substantially contiguous layer of particles on the substrate.

31. The method of claim 30 wherein the removing step comprises selectively removing the selected particles thereby leaving a plurality of substantially isolated non-selected particles spaced apart from one another by a substantially uniform distance.

* * * * *